United States Patent

Mathevosian

[15] 3,670,325

[45] June 13, 1972

[54] ANALOG TO DIGITAL ENCODER

[72] Inventor: Yervand Mathevosian, Cincinnati, Ohio

[73] Assignee: D. H. Baldwin Company, Cincinnati, Ohio

[22] Filed: May 4, 1970

[21] Appl. No.: 34,501

[52] U.S. Cl. ....................340/347 P, 250/206

[51] Int. Cl. ....................G08c 9/06

[58] Field of Search ....................340/347 P; 307/310, 311; 328/2, 3; 250/214 R; 84/1.18; 330/22, 23, 38 M, 40

[56] References Cited

UNITED STATES PATENTS

| | | | |
|---|---|---|---|
| 3,553,500 | 1/1971 | Easter | 307/311 |
| 3,428,813 | 2/1969 | Hofmeister | 307/310 X |
| 3,364,357 | 1/1968 | Burwen | 307/310 X |
| 3,524,184 | 8/1970 | Brean | 340/347 P |
| 3,334,309 | 8/1967 | Murphy et al | 328/2 X |
| 3,381,141 | 4/1968 | Millon | 307/310 X |

*Primary Examiner*—Maynard R. Wilbur
*Assistant Examiner*—Jeremiah Glassman
*Attorney*—Burmeister, Palmatier & Hamby

[57] ABSTRACT

A photoresponsive device employing a silicon photocell to excite on illumination of the photocell, a transistor in a discriminator circuit and drive the transistor from a non-conducting to a conducting condition. The photovoltaic output of the silicon photodiode is added to the direct current potential of a bias source to exceed the threshold conduction potential of the discriminator transistor. Thermal stability is achieved by employing a transistor in the bias source of identical type and similar characteristics to the discriminator transistor. The discriminator transistor has an emitter-collector circuit which includes a load resistor, and the output which is developed across the load resistor is amplified by a common emitter transistor amplifier circuit. The transistor of the amplifier circuit is an N-P-N type, while the transistor of the discriminator circuit is a P-N-P type. In addition to employing a bias source responsive to ambient temperature, a second bias source is used to reduce the collector-emitter potential of the discriminator transistor responsive to temperature increases. The second bias source utilizes a thermistor in addition to the emitter-collector potential of a bias supply transistor in order to compensate for the nonlinear temperature-output characteristics of silicon photodiodes.

11 Claims, 4 Drawing Figures

Inventor
YERVAND MATHEVOSIAN
By Burmeister, Palmatier & Hamby
Attorneys

Inventor
YERVAND MATHEVOSIAN
By Burmeister, Palmatier & Hamby
Attorneys

ANALOG TO DIGITAL ENCODER

The present invention relates generally to photoresponsive devices, and more particularly to analog to digital encoders. The present invention also relates to the use of silicon photodiodes in analog to digital encoders.

Optical encoders generally are available in two classes, namely, direct reading encoders in which the shaft angle is determined by sampling of a plurality of photocells which confront separate tracks of a code disc carried by the shaft, or the incremental type encoder in which rotation of a code disc or other code member with a single track confronting a single photocell generates pulses which are counted from an arbitrary zero position. The present invention may be used with either type of encoder, but for simplicity is illustrated applied to a direct reading encoder. U.S. Pat. No. 3,023,406 of Edward M. Jones, dated Feb. 27, 1962, entitled "OPTICAL ENCODER" discloses a direct reading encoder. An incremental encoder is disclosed in U.S. Pat. No. 3,058,001 of Michael L. Dertouzos, dated Oct. 9, 1962, entitled "PHOTOELECTRIC ENCODER."

In both direct reading encoders and incremental encoders, it is desired that the photocells produce a rapid response to changes in illumination, that the photocells be relatively insensitive to temperature changes and capable of being compensated for temperature changes, and that the photocells be reliable. Silicon P-N junction diodes have been used in photoelectric encoders, but their use has been limited by the relatively large capacity of the diode, the relatively low leakage resistance of the diode, and the relatively large sensitive area of such cells. Silicon diodes, however, have been significantly improved, as disclosed in U.S. Pat. No. 3,522,070 of John Brean and Curt M. Lampkin, entitled "PHOTODIODE ASSEMBLY FOR OPTICAL ENCODER," granted Aug. 4, 1970. In accordance with teachings of Brean and Lampkin, silicon diodes have been produced with significantly higher leakage resistance, significantly smaller sensitive areas, and significantly smaller capacity between the electrodes.

The patent application of Curt M. Lampkin entitled "ANALOG TO DIGITAL ENCODER", Ser. No. 34,502 filed May 4, 1970, discloses an improved electrical circuit for utilizing electrical output of silicon photodiodes. The present invention is an improvement on this circuit. While the Lampkin circuit for utilizing the electrical output of silicon photodiodes may be temperature compensated over a range of temperatures, this circuit will not permit compensation over a range of temperatures which is desired in general operating conditions, and it is therefore an object of the present invention to provide an improved electrical circuit for utilizing the electrical output of a silicon photodiode over a significantly wider range of temperatures than could heretofor be used.

One of the causes of temperature instability in the Lampkin circuit indicated above is the inability to compensate for the non-linear temperature-output characteristics of silicon photodiodes. It is not only necessary to compensate for the temperature characteristics of the transistors employed in the circuit of Lampkin, but it is also necessary to compensate for the fact that the electrical output of a silicon photodiode increases non-linear with increased temperature. It is therefore a further object of the present invention to provide a photoresponsive device utilizing a silicon photodiode which is provided with means for compensating for the changes in electrical output of the photodiode responsive to changes in ambient temperature.

In addition, it an object of the present invention to provide an analog to digital encoder employing such photoelectric devices. Briefly, the objects of the present invention are achieved by adding a bias potential to the electrical output of the silicon photodiode, the sum of the bias potential and electrical output of the illuminated photodiode being adequate to raise the potential of the base of the transistor in a switching circuit to result in conduction, whereas the bias voltage alone is inadequate for this purpose. A common emitter switching circuit, called a discriminator, is utilized, and a temperature compensating bias potential is applied to the base of the discriminator transistor. The bias potential is generated by a bias source which utilizes the emitter-collector potential of a transistor. In addition, a thermistor is connected between the emitter and collector of the transistor to provide a non-linear temperature characteristic to compensate for the non-linear temperature characteristics of the photodiode. The direct current bias supply for the photodiode also uses a transistor of identical type to that used in the discriminator and employs the emitter-base potential of the bias transistor to provide the necessary bias. As a result, variations in the ambient temperature affect the photodiode bias supply in identical manner with the discriminator circuit. The photoelectric device uses a P-N-P transistor in the discriminator circuit and an N-P-N transistor in an amplifier circuit coupled to the collector circuit of the discriminator circuit. In one particular construction of the present invention, the electric device operated satisfactorily over the temperature range from −50° C to 100° C.

Further advantages will be apparent to those skilled in the art from a further consideration of the specification, particularly when viewed in light of the drawings, in which:

FIG. 1 is a schematic diagram of a mechanical and electrical apparatus constructed in the manner disclosed by Curt M. Lampkin in his U.S. Pat. application Ser. No. 34,502 entitled "ANALOG TO DIGITAL ENCODER;"

Figures 1, 2:
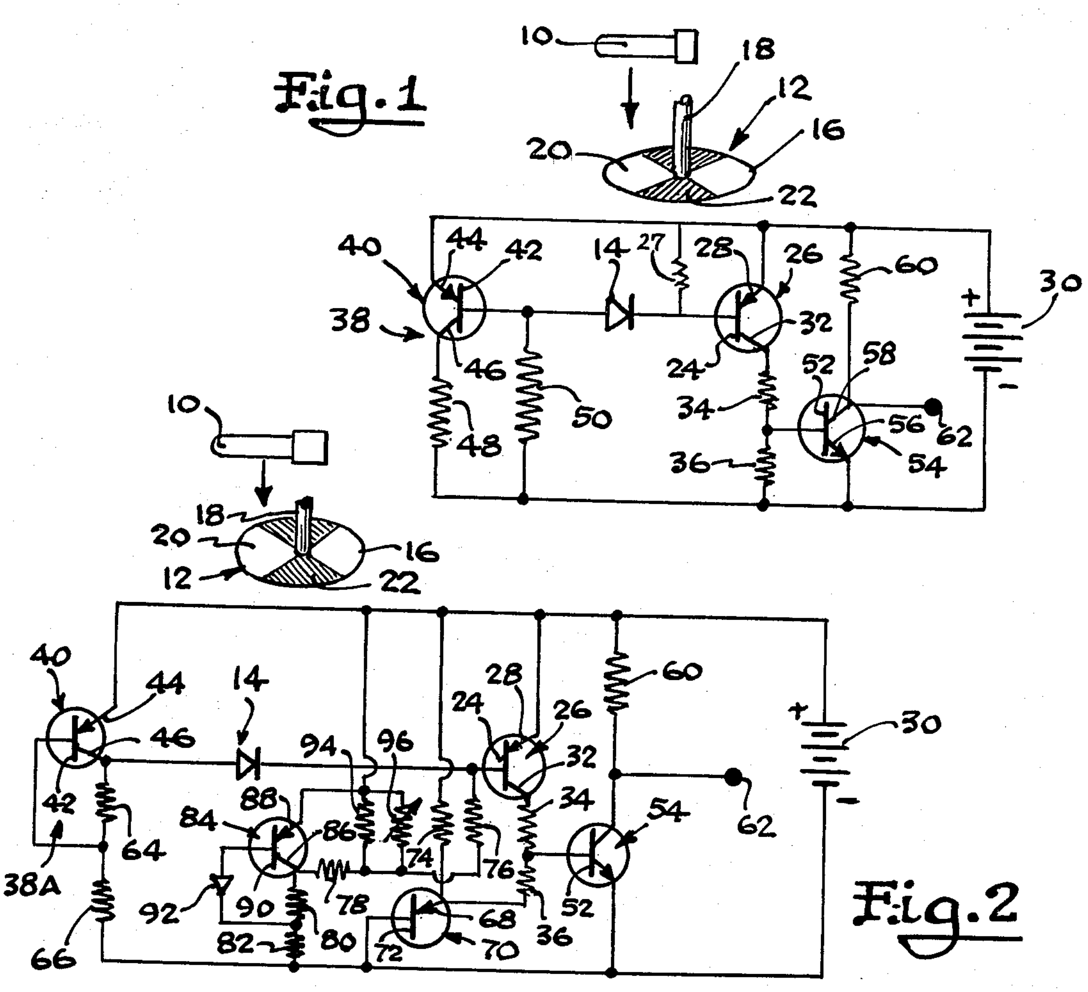
FIG. 2 is a schematic diagram of a mechanical and electrical apparatus comprising a photoelectric device according to the present invention.

FIG. 1 schematically illustrates a photoresponsive device disclosed in U.S. Pat. application Ser. No. of Curt M. Lampkin. A light source 10 in the form of a lamp directs light through a shutter 12 and and to a silicon photodiode 14. The photodiode 14 is constructed in the manner described in U.S. Pat. No. 3,522,070 of John Brean and Curt M. Lampkin. The shutter 12 is illustrated as a disc 16 which is mounted on a rotatable shaft 18, the disc having transparent sectors 20 and opaque sectors 22. Rotation of the disc 16 will therefore periodically interrupt the light impinging upon the photodiode 14.

A silicon photodiode has advantages over germanium and other types of cells in that silicon cells are fast in responding to changes in light level, and they may be operated over a wide range of temperatures. However, such cells produce a relatively small photovoltaic response to illumination over darkness, namely approximately 0.2 volts when illuminated by a conventional lamp as used in optical encoders.

In figure 1, the photodiode 14 is connected to pass positive charges to the base 24 of a transistor 26 connected in a discriminator or switching circuit. A bias resistor 27 is connected between base 24 and positive terminal of power source 30. The transistor 26 is a common emitter switching circuit, and has an emitter 28 connected to the positive terminal of a direct current power source 30, illustrated as a battery. The transistor 28 also has a collector 32 connected through two serially connected resistors 34 and 36 to the negative terminal of the power source 30.

Transistor 26 is a P-N-P silicon transistor which requires a base-emitter voltage far in excess of the photovoltaic voltage of the photodiode 14 for conduction. A bias potential is added to the photovoltaic output of the photodiode 14 to exceed the base-emitter threshold potential for conduction of the transistor 26. By making the bias potential less than the base-emitter threshold potential for conduction of transistor 26, transistor 26 will only conduct during periods in which illumination from the source 10 passes through the shutter 12 and impinges upon the photodiode 14. When illumination is cutoff, the emitter-collector current through transistor 26 is terminated, thereby providing a switching action. In Figure 1, a direct current bias source, designated 38, is provided between the terminal of the photodiode 14 opposite the base 24 and the positive terminal to the power source 30, and the bias source 38 places a potential on the photodiode 14 which is less than the base-emitter threshold potential of the transistor 26, but the photovoltaic output of the photodiode plus the bias potential exceeds this threshold. In one particular construction, the bias potential is approximately −0.5 volts with respect to the positive terminal of the power source 30, the source 30 having a potential of 5 volts direct current and the transistor 26 being type 2N4058 and requiring a collector to emitter potential for conduction of −0.6 volts direct current. The illuminated photodiode 14 has a photovoltaic output of −0.2 volts, thereby providing sufficient potential on illumination to cause a switching action in the transistor 26.

The bias source 38 utilizes a P-N-P transistor 40 with a base 42 connected to the photodiode 14 and an emitter 44 connected to the positive terminal of the power source 30. Hence, the bias source also uses a grounded emitter circuit to provide similar operating characteristics to the transistor 26. The transistor 40 has a collector 46 connected through a resistor 48 to the negative terminal of the power source 30. A resistor 50 is also connected from the base 42 to the negative terminal of the power source 30 to provide proper bias on the base 42. The transistors 26 and 40 are of identical type so that changes in ambient temperature will affect operation of the two transistors similarly. It is to be noted that an increase in temperature will result in an increase in current flowing through the transistor 40 and a decrease in the emitter to base potential. Also, an increase in ambient temperature results in a decrease in the emitter to base potential of transistor 26 required for conduction.

The voltage developed across resistor 36 is amplified by an N-P-N transistor 54. The transistor 54 has a base 52 electrically connected to the junction between the resistors 34 and 36, the transistor 54 being connected in an amplifier circuit. The transistor 54 has an emitter 56 connected to the negative terminal of the power source 30, and a collector 58 connected through a resistor 60 to the positive terminal of the power source 30. The output of the switching circuit appears upon a terminal 62 connected to the collector 58.

Figure 2 illustrates my improved switching circuit over that illustrated in Figure 1, like reference numerals being used for like elements. It will be noted that there are a number of differences in the circuits.

First, the bias supply 38A has been modified to employ the emitter-collector potential to bias the cell 14, thus providing constant forward bias on the photodiode 14. The transistor 40 has its collector 46 connected to the negative terminal of the power source 30 through serially connected resistors 64 and 66, and the base 42 of the transistor 40 is connected to the junction of resistors 64 and 66. The and the cell 14 is connected to the collector 46.

In the embodiment of Figure 2, both the base 24 and collector 32 of the transistor 26 are subject to positive temperature responsive bias potentials relative to the positive terminal of the power source 30. The collector 32 is connected to the emitter 68 of a transistor 70 through the resistors 34 and 36. The base 72 of the transistor 70 is connected to the negative terminal of the power source 30. The emitter 68 of the transistor 70 is connected to the positive terminal of the power source 30 through a resistor 74. Since increases in ambient temperature will result in an increase in current through the resistor 74, emitter 68 and base 72 of the transistor 70, the bias on the collector 32 of transistor 26 becomes less positive.

The base 24 of transistor 26 is connected to the negative terminal of the power source through a resistor 76, a second resistor 78, a third resistor 80, and a fourth resistor 82 connected in series. Resistors 80 and 82 are connected in the emitter-collector circuit of a transistor 84, generically referred to as a junction device, the collector 86 of the transistor being connected to the junction between the resistors 78 and 80. The emitter 88 of the transistor 84 is connected directly to the positive terminal of the power source. The transistor 84 also has a base 90 which is connected to the junction of resistors 80 and 82 through a diode 92 connected to pass positive charges from the base 90, thereby permitting the base-emitter junction to function as a diode. The emitter-base junction of transistor 84, the diode 92, and the resistor 82 provide a constant-current flow at a given temperature and establishes the potential at the junction of resistors 80 and 82. The emitter 88 is also connected to a resistor 94 connected to the junction between resistors 76 and 78, and a thermistor 96 is connected in parallel with the resistor 94. The bias potential applied to the base 24 of the transistor 26 is determined by the voltage drop across the resistor 82 and resistor network. As the temperature rises, the potential difference across the resistor 82 will increase, thus making the potential on the base 24 of transistor 26 more positive and reducing the emitter-base potential difference, thus compensating for the change in the emitter-base current gain with increased temperature. As the temperature rises, the resistance of the thermistor 96 falls, thereby further increasing the potential on the base 24 with the upper limit the positive potential of the power source, thus compensating for the change in output of the silicon photodiode with a change in temperature. Hence, as the temperature rises, the potential of the bias on the base 24 of transistor 26 increases positively, and the bias on the collector 32 thereof falls, thus compensating for the decrease in the base to collector potential required for conduction of the transistor 24 with an increase in temperature. Thus, even though the bias potential on the silicon photodiode 14 also becomes more positive, a greater photovoltaic response to irradiation from the photodiode 14 is needed to produce conduction in the transistor 26 at elevated ambient temperatures than will achieve this result at lower ambient temperatures, and the photodiode 14 has this characteristic.

The amplifier transistor 54 has its base 52 connected to the junction of the resistors 34 and 36. Hence the base is subjected to a positive bias potential relative to the negative terminal of the power source 30 compensated for temperature changes by the transistor 70.

Figure 3:
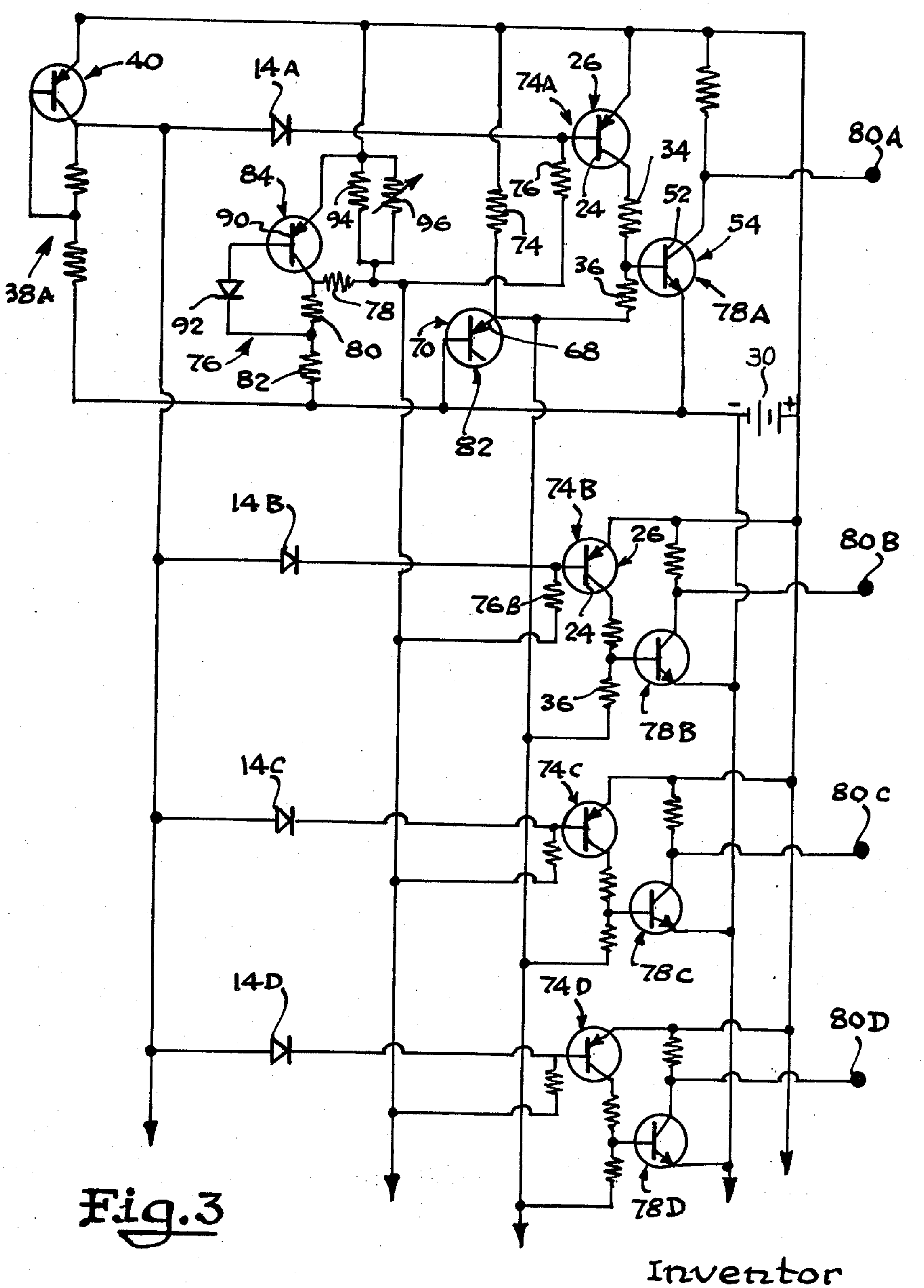
FIG. 3 is a schematic electrical circuit diagram of the photoelectric devices utilized in an analog to digital encoder.

Figure 3 illustrates an optical analog to digital encoder which utilizes the light source 10, a code disc 12A, and a photo- diode assembly $\overline{14}$. The code disc is mounted to rotate with the shaft 18, and is constructed of a transparent disc 65, which may be glass, provided with a layer of opaque material 67, which may be a photographic emulsion. The layer of opaque material 67 contains tracks which consist of alternate transparent sectors 71 and opaque sectors 73.

The photodiode assembly $\overline{14}$ is disposed upon a radius of the code disc 12A and contains a silicon photodiode confronting each of the tracks 69 of the code disc 12. Photodiode assembly $\overline{14}$ is constructed in the manner of the patent of John Brean and Curt M. Lampkin, No. 3,522,070.

Figure 4:
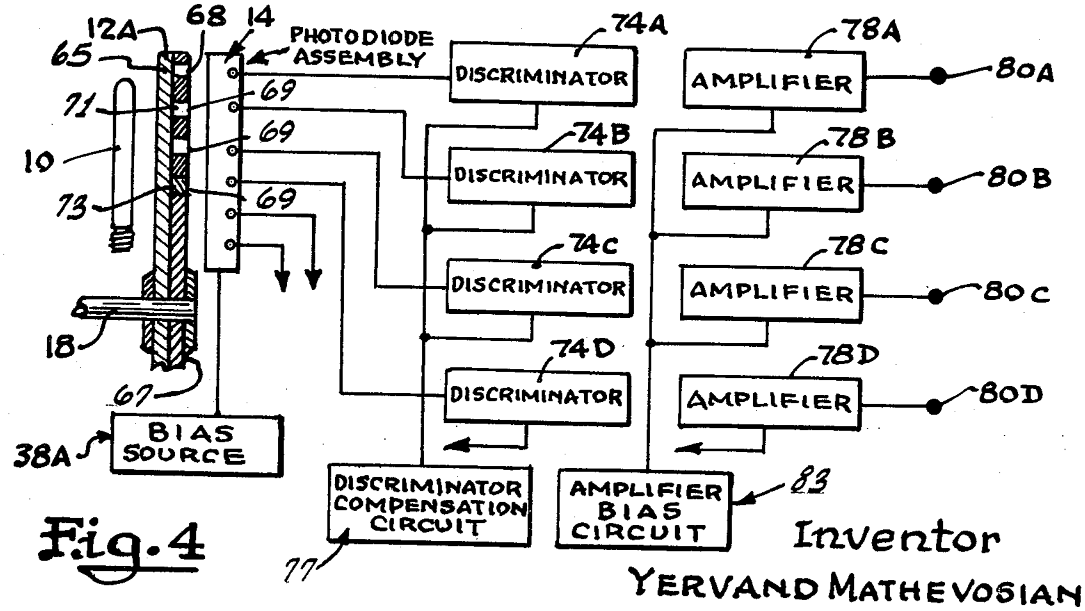
FIG. 4 is a schematic diagram of an analog to digital encoder employing the electrical circuits schematically illustrated in Figure 3, the electrical circuits being shown in block form.

Each of the photodiodes of the assembly $\overline{14}$ is connected to a discriminator, the discriminators being designated 74A, 74B, 74C, and 74D. It is to be understood that four discriminators are illustrated, one for each of four photodiodes, the photodiodes being designated in Figure 3 by the reference numerals 14A, 14B, 14C and 14D. The illustrated optical encoder contains but four digits, although it is to be understood that additional digits may be provided and the present invention may be utilized with any number of photocells, each photocell having a separate discriminator, the arrows in Figures 3 and 4 indicating the locations in which additional photodiodes and discriminators are connected. It will be noted that a single bias source 38A is connected to one terminal of each of the photodiodes in the photodiode assembly $\overline{14}$. Likewise, a single discriminator compensation circuit 77 is connected to each of the discriminators 74A, 74B, 74C and 74D.

Each of the discriminators is connected to an amplifier, discriminator 74A being connected to amplifier 78A, discriminator 74B being connected to amplifier 78B, discriminator 74C being connected to amplifier 78C, and discriminator 74D being connected to amplifier 78D. The electrical output of each of the amplifiers appears upon an output terminal, 80A, 80B, 80C, and 80D, respectively. A common amplifier bias circuit 83 is connected to each of the amplifiers.

As indicated in Figure 3, the bias source 38A is identical to that shown in Figure 2, and will not be further described. Likewise, the discriminator compensation circuit 77 is identical to that described in Figure 2 and will not be further described. Further, the amplifier bias circuit 83 is identical to that described in Figure 2. Like reference numerals have been applied to identical components in Figures 2 and 3.

Photodiode 14A is electrically connected to the base 24 of transistor 26 in discriminator 74A. The discriminator 74A is identical to the discriminator illustrated in FIG. 2, and will not be further described. Likewise, the amplifier 78A employs a transistor 54 with a base 52 connected to the junction of resistors 34 and 36, in the same manner as that illustrated in FIG. 2, and the output of the amplifier 78A appears on output terminal 80A.

Photodiode 14B is connected to a discriminator 74B identical in construction to the discriminator 74A. The discriminator 74B is connected through an amplifier 78B identical to the amplifier 78A to an outlet terminal 80B. It is to be noted that the base 24 of transistor 26 of discriminator 74B is connected through a resistor 76B to the junction of resistor 78 and thermistor 96 of the discriminator compensation circuit 77, thereby sharing the same discriminator compensation circuit as discriminator 74A. The same is true of discriminator 74C and 74D. In like manner, the base 52 of transistor 54 of amplifier 78B is connected to the emitter 68 of transistor 70 of the same amplifier bias circuit 83 as amplifier 78A through resistor 36, thereby sharing the same amplifier circuit. The same is true of amplifier 78C and 78D. Regardless of the number of digits of the encoder, each digit requiring a separate photodiode, only a single discriminator compensation circuit 77 and a single amplifier bias circuit 83 is required.

By compensating for both changes in transistor characteristics with changes in temperature and changes in photovoltaic voltage of the silicon photodiode, the time relationship of the discriminators 74A, 74B, 74C, and 74D with transitions of the code disc 12A is preserved. Rotation of the code disc 12A produces an electrical output from the photodiodes which is a function of time, that is, has a sloping leading and trailing edge. Since the output of the photodiodes is markedly increased at higher temperatures, merely compensating for the change in transistor characteristics with increased temperature would result in the transition producing a change in electrical output on the output terminals 80A, 80B, 80C, or 80D sooner than a similar transition would at lower temperatures. The discriminator compensation circuit 77 compensates for the change in output of the photodiodes at elevated temperatures, thereby preserving the time relationship between the transition and the change in electrical output.

The electrical output may be used directly from the terminals 80A, 80B, 80C, and 80D, or it may be deferred in time by an interrogation system, such as disclosed in the above referred to patent application of Curt M. Lampkin.

While the foregoing specification describes the transistors 26 as being of the P-N-P type and the transistors 54 as being of an N-P-N type, the present invention may be practiced with transistors 26 of an N-P-N type and transistors 54 of the P-N-P type. It is preferred that the emitter and collector of the transistors 26 be of semi-conducting material doped with impurities of one type, and the transistors 54 having emitters and collectors of semi-conducting material doped with impurities of another type, the types of impurities being either to produce an excess of electrons in the semi-conductive material or an excess of holes. In all transistors, the base must be of semi-conductive material doped with impurities of a type opposite the base and emitter of that transistor.

Those skilled in the art will readily appreciate many modified constructions of the present invention and many utilities of the present invention beyond that here set forth. It is therefore intended that the scope of the present invention be not limited by the foregoing disclosure, but rather only by the appended claims.

I claim:

1. A photoresponsive device adapted for use in an analog to digital encoder comprising, in combination: a light source, a silicon photodiode having a first and a second terminal adapted to generate a potential across said terminals responsive to light from the source, a mechanically actuatable light shutter disposed between the light source and the silicon photodiode, a first transistor having a base, a collector and an emitter, the emitter and collector being of semi-conductor material doped with impurities of a first type and the base being of semi-conductor material doped with impurities of a second type, the base of said first transistor being electrically connected to the second terminal of the photodiode, said first transistor being electrically connected in a common emitter switching circuit having a direct current source in series with the emitter and collector of the first transistor, a direct current bias source having a positive terminal connected to the first terminal of the photodiode and a negative terminal connected to the direct current source, said bias source maintaining a direct current potential on the first terminal of the photodiode less than the minimum potential on the base of the first transistor for transistor conductance and the sum of the bias source potential and the output potential of the illuminated photodiode exceeding the minimum potential on the base of the first transistor for conduction, a second bias source electrically connected between the base of the first transistor and the power source, the second bias source decreasing the emitter-base potential nonlinearly responsive to increases in temperature, a third direct current bias source electrically connected between the collector and the power source, said third bias source decreasing the collector-emitter potential and increasing the base-collector potential responsive to increases in temperature, and a load electrically connected in the series emitter-collector circuit of the first transistor.

2. A photoresponsive device comprising the combination of claim 1 wherein the second bias source comprises a solid state junction device electrically connected in a series circuit with a resistor and the power source, one of the terminals of the junction device being connected to the emitter of the first transistor and the other terminal of the junction device being electrically connected to the base of the first transistor, and a thermistor electrically connected between the terminals of the junction device.

3. A photoresponsive device comprising the combination of claim 2 in combination with a second resistor electrically connected between the second terminal of the junction device and the thermistor.

4. A photoresponsive device comprising the combination of claim 1 in combination with a direct current amplifier coupled to the load, said direct current amplifier comprising a second transistor connected in a common emitter amplifier circuit, said second transistor having a base of semi-conductor material doped with impurities of the first type, and a collector and an emitter of semi-conductor material doped with impurities of the second type, the load being electrically connected in a series circuit with base and emitter of the second transistor, and the collector and emitter of the second transistor being electrically connected in a series electrical circuit with a second load and the direct current power source, whereby the electrical output of the device appears across the second load, the third bias source also being electrically connected between the base of the second transistor and the power source and decreasing the emitter-base potential of the second transistor responsive to increases in temperature.

5. A photoresponsive device comprising the combination of claim 1 wherein the potential of the first direct current bias source changes with temperature approximately the same as the base to emitter potential of the first transistor changes with temperature.

6. A photoresponsive device comprising the combination of claim 5 wherein the first direct current bias source comprises a third transistor of the same type as the first transistor, said third transistor having a collector electrically connected to the first terminal of the photodiode, said third transistor having an emitter electrically connected to the emitter of the first transistor, a first resistor connected to the collector of the third transistor and in series with a second resistor, the first and second resistor and the third transistor being connected in a series common emitter circuit with the power source, and said third transistor having a base electrically connected to the junction of the first and second resistors, whereby the potential difference across the third transistor is utilized as the first direct current bias potential.

7. A position responsive analog to digital encoder comprising, in combination: a code member adapted to be moved responsive to positional changes to be encoded having a plurality of tracks of transparent sectors separated by opaque sectors, each track moving responsive to positional changes normal to a read-out line disposed in a fixed position relative to the code member, a light source confronting one side of the code member illuminating each track of the code member at the read-out line, a plurality of photodiodes having a first and a second terminal, each track of the code member being confronted by a photodiode at the read-out line thereof to receive illumination from the track, a plurality of switching transistors, each switching transistor having a base of semi-conductor material doped with impurities of a first type and a collector and emitter of semi-conductor material doped with impurities of a second type, the second terminal of each photodiode being connected to the base of a different switching transistor, each of said switching transistors being connected in a separate common emitter switching circuit and having a collector-emitter circuit with the direct current power source and a resistor, a first direct current bias source having a positive terminal connected to the first terminal of all photodiodes and a negative terminal connected to the direct current source, said bias source maintaining a direct current potential on the first terminal of each photodiode less than the minimum potential on the base of the switching transistor connected to said diode for conductance, the sum of the bias source potential and the output potential of the illuminated photodiode exceeding the minimum potential on the base of the switching transistor for conduction, a second bias source electrically connected between the base of each switching transistor and the power source, the second bias source decreasing the emitter-base potential of each transistor non-linearly responsive to an increase in ambient temperature, a third direct current bias source having a positive terminal electrically connected to a plurality of resistors, each resistor of said plurality being electrically connected in series with the resistor of a different switching circuit, said third bias source having a negative terminal connected to the power source, said third bias source decreasing the collector-emitter potential and increasing the base-collector potential of each switching circuit responsive to increases in temperature, and a load electrically connected in the series emitter-collector circuit of each switching transistor.

8. A position responsive analog to digital encoder comprising the combination of claim 7 wherein the first direct current bias source comprises a bias transistor of the same type as the switching transistors and of similar characteristics, said bias transistor having a collector electrically connected to the first terminal of each photodiode, said bias transistor being connected in a common emitter series circuit with the power source and a resistor.

9. A position responsive device comprising the combination of claim 7 wherein the second bias source comprises a solid state junction device having a first and a second terminal, said junction device being electrically connected in a series circuit with a resistor and the power source, the first of the terminals of the junction device being electrically connected to the emitters of the switching transistors.

10. A position responsive device comprising the combination of claim 9 in combination with a thermistor electrically connected between the first and second terminals of the junction device.

11. A position responsive analog to digital encoder comprising the combination of claim 7 in combination with a plurality of direct current amplifiers, each amplifier having a second transistor and being coupled to the load of a different switching transistor and having a transistor with a base of semi-conductor material doped with impurities of the first type, and an emitter and a collector doped with impurities of the second type, each amplifier being connected in a common emitter amplifier circuit.

* * * * *